(12) United States Patent
Tonegawa et al.

(10) Patent No.: US 12,032,043 B2
(45) Date of Patent: Jul. 9, 2024

(54) MAGNETIC SENSOR

(71) Applicant: SHOWA DENKO K.K., Tokyo (JP)

(72) Inventors: Sho Tonegawa, Ichihara (JP); Akira Sakawaki, Ichihara (JP); Yasumasa Watanabe, Ichihara (JP); Daizo Endo, Ichihara (JP); Tomoyuki Noguchi, Ichihara (JP); Yuta Miyamoto, Ichihara (JP)

(73) Assignee: Resonac Corporation, Tokyo (JP)

( * ) Notice: Subject to any disclaimer, the term of this patent is extended or adjusted under 35 U.S.C. 154(b) by 303 days.

(21) Appl. No.: 17/499,513

(22) Filed: Oct. 12, 2021

(65) Prior Publication Data

US 2022/0128634 A1 Apr. 28, 2022

(30) Foreign Application Priority Data

Oct. 26, 2020 (JP) ................................. 2020-178835

(51) Int. Cl.
| | |
|---|---|
| *G01R 33/06* | (2006.01) |
| *H01L 43/02* | (2006.01) |
| *H01L 43/12* | (2006.01) |
| *H10N 50/01* | (2023.01) |
| *H10N 50/80* | (2023.01) |

(52) U.S. Cl.
CPC ........... *G01R 33/063* (2013.01); *H10N 50/01* (2023.02); *H10N 50/80* (2023.02)

(58) Field of Classification Search
CPC ............. G01R 33/063; G01R 33/0011; G01R 33/038; G01R 33/09; G01R 33/091; G01R 33/096; H10N 50/01; H10N 50/80
See application file for complete search history.

(56) References Cited

U.S. PATENT DOCUMENTS

| | | | |
|---|---|---|---|
| 6,222,361 B1* | 4/2001 | Shimano | G01R 33/09 324/252 |
| 2014/0266185 A1* | 9/2014 | Sidman | G01R 33/0005 324/252 |
| 2018/0038898 A1* | 2/2018 | Shimizu | G01R 33/07 |
| 2020/0011902 A1* | 1/2020 | Shimizu | G01R 19/0092 |

FOREIGN PATENT DOCUMENTS

| | | |
|---|---|---|
| JP | 2004-264215 A | 9/2004 |
| JP | 2008-249406 A | 10/2008 |

* cited by examiner

*Primary Examiner* — Christopher P McAndrew
*Assistant Examiner* — Zannatul Ferdous
(74) *Attorney, Agent, or Firm* — Sughrue Mion, PLLC (57) ABSTRACT

In a magnetic sensor using a magnetic impedance effect, sensitivity is improved as compared to the case where a width of a sensitive element in the short direction is equal from one end to the other end in the longitudinal direction. The magnetic sensor includes: a non-magnetic substrate; and a sensitive element that is provided on the substrate, composed of a soft magnetic material, having a longitudinal direction and a short direction, provided with uniaxial magnetic anisotropy in a direction crossing the longitudinal direction, having a width at a center portion in the longitudinal direction that is smaller compared to a width at each of both end portions in the longitudinal direction, and sensing a magnetic field by a magnetic impedance effect.

4 Claims, 6 Drawing Sheets

MAGNETIC SENSOR

CROSS REFERENCE TO RELATED APPLICATIONS

This application is based on and claims priority under 35 USC § 119 to Japanese Patent Application No. 2020-178835 filed Oct. 26, 2020, the disclosure is incorporated herein by reference in its entirety.

BACKGROUND

Technical Field

The present invention relates to a magnetic sensor.

Related Art

As a related art described in a gazette, there is a magnetic impedance effect element including a magneto-sensitive part configured with plural soft magnetic material films provided with uniaxial anisotropy (refer to Japanese Patent Application Laid-Open Publication No. 2008-249406). The magneto-sensitive part of the magnetic impedance effect element has a rectangular shape that has an equal width in the short direction from one end to the other end in the longitudinal direction.

In a magnetic sensor having the longitudinal direction and short direction, and provided with sensitive elements that are sensitive to magnetic fields due to the magnetic impedance effect, there is a possibility that sensitivity may be insufficient in the case where the width of the sensitive element in the short direction is equal from one end to the other end in the longitudinal direction.

An object of the present invention is to improve sensitivity in a magnetic sensor using a magnetic impedance effect as compared to the case where a width of a sensitive element in the short direction is equal from one end to the other end in the longitudinal direction.

SUMMARY

A magnetic sensor to which the present invention is applied includes: a non-magnetic substrate; and a sensitive element that is provided on the substrate, composed of a soft magnetic material, having a longitudinal direction and a short direction, provided with uniaxial magnetic anisotropy in a direction crossing the longitudinal direction, having a width at a center portion in the longitudinal direction that is smaller compared to a width at each of both end portions in the longitudinal direction, and sensing a magnetic field by a magnetic impedance effect.

Moreover, in the sensitive element, a width in the short direction may be continuously reduced from both end portions to the center portion in the longitudinal direction.

Moreover, the sensitive element includes plural sensitive elements arranged in the short direction with intervals, and a connection part is included to connect end portions of the sensitive elements in the longitudinal direction, the sensitive elements being adjacent to each other in the short direction, and the width of the connection part in the short direction being narrowed as approaching the sensitive elements along the longitudinal direction.

Moreover, a ratio between the width of the sensitive element at each of both end portions in the longitudinal direction and the width of the sensitive element at the center portion in the longitudinal direction is in a range from 100:60 to 100:90.

According to the present invention, it is possible to improve sensitivity in the magnetic sensor using the magnetic impedance effect as compared to the case where the width of the sensitive element in the short direction is equal from one end to the other end in the longitudinal direction.

BRIEF DESCRIPTION OF THE DRAWINGS

An exemplary embodiment of the present invention will be described in detail based on the following figures, wherein.

DETAILED DESCRIPTION

Hereinafter, exemplary embodiments according to the present invention will be described with reference to attached drawings.

Figure 1:
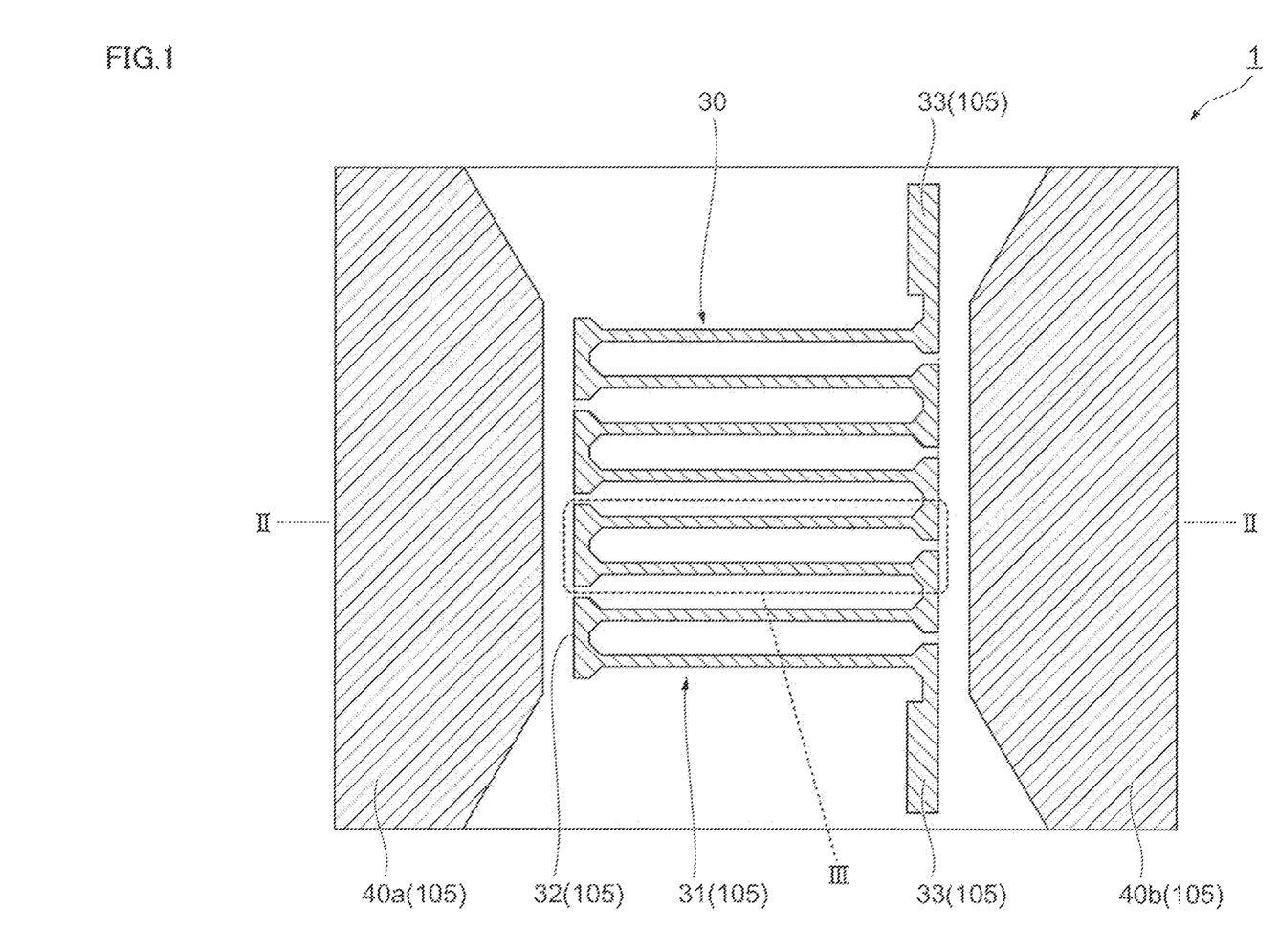
FIG. 1 illustrates a specific example of a magnetic sensor to which the exemplary embodiment is applied.
Figure 2:
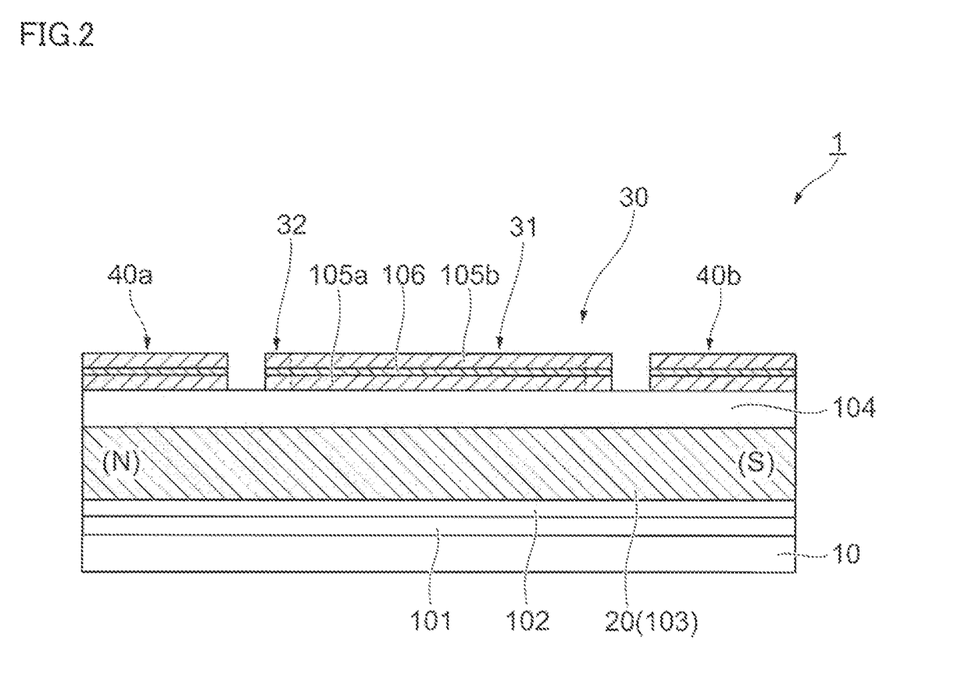
FIG. 2 illustrates a specific example of a magnetic sensor to which the exemplary embodiment is applied.

FIGS. 1 and 2 illustrate a specific example of a magnetic sensor 1 to which the exemplary embodiment is applied. FIG. 1 is a plan view and FIG. 2 is a cross-sectional view along the II-II line in FIG. 1.

As shown in FIG. 2, the magnetic sensor 1 to which the exemplary embodiment is applied includes: a thin film magnet 20 configured with a hard magnetic material (a hard magnetic material layer 103) provided on a nonmagnetic substrate 10; and a sensitive part 30 laminated to face the thin film magnet 20 and configured with a soft magnetic material (a lower soft magnetic material layer 105a and an upper soft magnetic material layer 105b) and a conductor layer (a high conductive layer 106) with conductivity higher than that of a soft magnetic material layer 105 to sense a magnetic field. In the following description, in the case where the two soft magnetic material layers (the lower soft magnetic material layer 105a and the upper soft magnetic material layer 105b) are not differentiated, the two layers are simply referred to as the soft magnetic material layer 105. Note that a cross-sectional structure of the magnetic sensor 1 will be described in detail later.

Here, the hard magnetic material has a large, so-called coercive force, the hard magnetic material being once magnetized by an external magnetic field, even upon removal of the external magnetic field, maintaining the magnetized state. On the other hand, the soft magnetic material has a small, so-called coercive force, the soft magnetic material being easily magnetized by an external magnetic field, but, upon removal of the external magnetic field, quickly returning to a state with no magnetization or a little magnetization.

Note that, in the present specification, an element constituting the magnetic sensor 1 (the thin film magnet 20 or the like) is indicated by a two-digit number, and a layer processed into an element (the hard magnetic material layer 103 or the like) is indicated by a number of one hundreds. Then, for a figure indicating an element, a figure indicating a layer processed into the element is written in parentheses. For example, the case of the thin film magnet 20 is written as thin film magnet 20 (hard magnetic material layer 103). In the figure, the case is written as 20 (103). The same is true in other cases.

Description will be given of a planar structure of the magnetic sensor 1 by FIG. 1. The magnetic sensor 1 has a quadrangular planar shape as a specific example. Here, the sensitive part 30 and yokes 40 formed at the uppermost portion of the magnetic sensor 1 will be described. The sensitive part 30 includes: plural reed-shaped sensitive elements 31 each having a longitudinal direction and a short direction in a planar shape thereof; connection parts 32 windingly performing serial connection of the adjacent sensitive elements 31; and terminal parts 33 to which electric wires for supplying the electrical current are connected. Here, eight sensitive elements 31 are arranged with intervals in the short direction so that the longitudinal directions of the sensitive elements 31 are in parallel with one another. In addition, in the magnetic sensor 1 of the exemplary embodiment, sensitive element 31 serves as a magneto-impedance effect element.

The connection part 32 is provided between end portions of the adjacent sensitive elements 31 in the longitudinal direction and windingly performs serial connection of the adjacent sensitive elements 31. In the magnetic sensor 1 shown in FIG. 1, the eight sensitive elements 31 are disposed in parallel, and therefore there are seven connection parts 32.

Note that the planar shape of the sensitive element 31 and the connection part 32 will be described in detail later.

The terminal parts 33 are provided to the two respective end portions of the sensitive parts 31, the end portions not being connected to the connection parts 32. The terminal part 33 includes a drawn-out part that is drawn out of the sensitive element 31 and a pad part connecting electric wires for supplying the electrical current. The drawn-out part is provided to dispose two pad parts in the short direction of the sensitive element 31. It may be possible to provide the pad part to be continuous with the sensitive element 31 without providing the drawn-out part. The pad part may have a size capable of connecting the electric wires. Note that, since there are eight sensitive elements 31, the two terminal parts 33 are provided on the right side in FIG. 1. In the case where the number of sensitive elements 31 is an odd number, two terminal parts 33 may be provided into right and left.

Then, the sensitive elements 31, the connection parts 32 and the terminal parts 33 of the sensitive part 30 are integrally constituted by the two-layer soft magnetic material layer 105 (the lower soft magnetic material layer 105a and the upper soft magnetic material layer 105b) and the high conductive layer 106. The soft magnetic material layer 105 and the high conductive layer 106 have conductivity, and therefore, it is possible to apply the electrical current from one terminal part 33 to the other terminal part 33.

Note that the above-described numerical values, such as the length and the width of the sensitive element 31 and the number of sensitive elements 31 to be disposed in parallel, are merely a specific example; the numerical values may be changed in accordance with the value of the magnetic field to be sensed (measured) or the soft magnetic material to be used.

Further, the magnetic sensor 1 includes yokes 40 each of which is provided to face the end portions of the sensitive elements 31 in the longitudinal direction thereof. Here, there are provided two yokes 40a and 40b, each of which is provided to face each of both end portions of the sensitive elements 31 in the longitudinal direction thereof. Note that, in the case where the yokes 40a and 40b are not distinguished, the yokes are referred to as yokes 40. The yoke 40 guides lines of magnetic force to the end portion of the sensitive element 31 in the longitudinal direction thereof. Therefore, the yokes 40 are constituted to include the soft magnetic material (the soft magnetic material layer 105) through which the lines of magnetic force are likely to pass through. In this specific example, the sensitive part 30 and the yokes 40 are constituted by the two-layer soft magnetic material layer 105 (the lower soft magnetic material layer 105a and the upper soft magnetic material layer 105b) and the high conductive layer 106. Note that, in the case where the lines of magnetic force sufficiently pass through in the longitudinal direction of the sensitive element 31, it is unnecessary to provide the yokes 40.

From above, the size of the magnetic sensor 1 is several millimeters square in the planar shape. Note that the size of the magnetic sensor 1 may be other values.

Next, with reference to FIG. 2, the cross-sectional structure of the magnetic sensor 1 will be described in detail. The magnetic sensor 1 is configured by laminating an adhesive layer 101, a control layer 102, the thin film magnet 20 formed of the hard magnetic material layer 103, a dielectric layer 104, and the sensitive part 30 and the yokes 40 formed of the soft magnetic material layer 105 and the high conductive layer 106 in this order on the nonmagnetic substrate 10.

The substrate 10 is composed of a non-magnetic material; for example, an oxide substrate, such as glass or sapphire, a semiconductor substrate, such as silicon, or a metal substrate, such as aluminum, stainless steel, or a nickel-phosphorus-plated metal, can be provided.

The adhesive layer 101 is a layer for improving adhesiveness of the control layer 102 to the substrate 10. As the adhesive layer 101, it is preferable to use an alloy containing Cr or Ni. Specific examples of the alloy containing Cr or Ni include CrTi, CrTa and NiTa. The thickness of the adhesive layer 101 is, for example, 5 nm 50 nm. Note that, if there is no problem in adhesiveness of the control layer 102 to the substrate 10, it is unnecessary to provide the adhesive layer 101. Note that, in the present specification, composition ratios of alloys containing Cr or Ni are not shown. The same applies hereinafter.

The control layer 102 controls the magnetic anisotropy of the thin film magnet 20 constituted by the hard magnetic material layer 103 to be likely to express in the in-plane direction of the film. As the control layer 102, it is preferable to use Cr, Mo or W, or an alloy containing thereof (hereinafter, referred to as an alloy containing Cr or the like to constitute the control layer 102). Specific examples of the alloy containing Cr or the like to constitute the control layer 102 include CrTi, CrMo, CrV and CrW. The thickness of the control layer 102 is, for example, 10 nm 300 nm.

It is preferable that the hard magnetic material layer 103 constituting the thin film magnet 20 uses an alloy that contains Co as a main component and also contains at least one of Cr and Pt (hereinafter, referred to as a Co alloy constituting the thin film magnet 20). Specific examples of the Co alloy constituting the thin film magnet 20 include CoCrPt, CoCrTa, CoNiCr and CoCrPtB. Note that Fe may be contained. The thickness of the hard magnetic material layer 103 is, for example, 1 μm to 3 μm.

The alloy containing Cr or the like to constitute the control layer 102 has a bcc (body-centered cubic) structure. Consequently, the hard magnetic material constituting the thin film magnet 20 (the hard magnetic material layer 103) preferably has an hcp (hexagonal close-packed) structure easily causing crystal growth on the control layer 102 composed of the alloy containing Cr or the like having the bcc structure. When crystal growth of the hard magnetic material layer 103 having the hcp structure is caused on the bcc structure, the c-axis of the hcp structure is likely to be oriented in a plane. Therefore, the thin film magnet 20 configured with the hard magnetic material layer 103 is likely to have the magnetic anisotropy in the in-plane direction. Note that the hard magnetic material layer 103 is polycrystalline composed of a set of different crystal orientations, and each crystal has the magnetic anisotropy in the in-plane direction. The magnetic anisotropy is derived from crystal magnetic anisotropy.

Note that, to promote the crystal growth of the alloy containing Cr or the like to constitute the control layer 102 and the Co alloy constituting the thin film magnet 20, the substrate 10 may be heated to 100° C. to 600° C. By the heating, the crystal growth of the alloy containing Cr or the like constituting the control layer 102 is likely to be caused, and thereby crystalline orientation is likely to be provided so that the hard magnetic material layer 103 having the hcp structure includes an axis of easy magnetization in a plane. In other words, the magnetic anisotropy is likely to be imparted in a plane of the hard magnetic material layer 103.

The dielectric layer 104 is configured with a nonmagnetic dielectric material and electrically insulates the thin film magnet 20 and the sensitive part 30. Specific examples of the dielectric material constituting the dielectric layer 104 include oxide, such as $SiO_2$, $Al_2O_3$, or $TiO_2$, or nitride, such as $Si_3N_4$ or AlN. In addition, the thickness of the dielectric layer 104 is, for example, 0.1 μm to 30 μm.

The sensitive element 31 of the sensitive part 30 is provided with uniaxial magnetic anisotropy in a direction crossing the longitudinal direction, for example, the short direction intersecting the longitudinal direction (in other words, the width direction of the sensitive element 31). Note that the direction crossing the longitudinal direction may have an angle exceeding 45° with respect to the longitudinal direction.

As the soft magnetic material constituting the sensitive part 30 (the lower soft magnetic material layer 105a and the upper soft magnetic material layer 105b), it is preferable to use an amorphous alloy, which is an alloy containing Co as a main component doped with a high melting point metal, such as Nb, Ta or W (hereinafter, referred to as a Co alloy constituting the sensitive part 30). Specific examples of the Co alloy constituting the sensitive part 30 include CoNbZr, CoFeTa and CoWZr. The thickness of the soft magnetic material constituting the sensitive element 31 (the lower soft magnetic material layer 105a and the upper soft magnetic material layer 105b) is, for example, 0.2 μm to 2 μm for each. In the specific example shown in FIG. 2, the thickness of the lower soft magnetic material layer 105a and the thickness of the upper soft magnetic material layer 105b are equal to each other, but may be different from each other.

Note that, in this case, the sensitive element 31, the connection part 32 and the terminal part 33 of the sensitive part 30 are composed of the same material; however, these components may be composed of materials that are different from each other. For example, a material with high conductivity compared to that of the sensitive element 31 may be used for the connection part 32 and the terminal part 33. In this case, it is possible to reduce the resistance in the connection part 32 and the terminal part 33.

As the conductor (the high conductive layer 106) constituting the sensitive element 31, it is preferable to use metal or an alloy having high conductivity, and is more preferable to use metal or an alloy that is highly conductive and non-magnetic. Specifically, as the conductor (the high conductive layer 106) constituting the sensitive element 31, it is better to use metal, such as aluminum, copper, silver, or the like. The thickness of the conductor (the high conductive layer 106) constituting the sensitive element 31 is, for example, 10 nm to 500 nm. The thickness of the conductor (the high conductive layer 106) constituting the sensitive element 31 can be changed depending on the type of the Co alloy constituting the sensitive element 31 used as the soft magnetic material layer 105, the conductor used as the high conductive layer 106, and so on.

The adhesive layer 101, the control layer 102, the hard magnetic material layer 103 and the dielectric layer 104 are processed to have a quadrangular planar shape (refer to FIG. 1). Then, of the exposed side surfaces, in the two facing side surfaces, the thin film magnet 20 serves as the north pole ((N) in FIG. 2) and the south pole ((S) in FIG. 2). Note that the line connecting the north pole and the south pole of the thin film magnet 20 takes the longitudinal direction of the sensitive element 31. Here, to take the longitudinal direction means that an angle formed by the line connecting the north pole and the south pole and the longitudinal direction is less than 45°. Note that the smaller the angle formed by the line connecting the north pole and the south pole and the longitudinal direction, the better.

In the magnetic sensor 1, the lines of magnetic force outputted from the north pole of the thin film magnet 20 once go to the outside of the magnetic sensor 1. Then, a part of the lines of magnetic force passes through the sensitive element 31 via the yoke 40a and goes to the outside again via the yoke 40b. The lines of magnetic force that have passed through the sensitive element 31 return to the south pole of the thin film magnet 20 together with the lines of magnetic force that have not passed through the sensitive element 31. In other words, the thin film magnet 20 applies the magnetic field (the bias magnetic field Hb to be described later) to the longitudinal direction of the sensitive element 31.

Note that the north pole and the south pole of the thin film magnet 20 are collectively referred to as both magnetic poles, and when the north pole and the south pole are not distinguished, they are referred to as a magnetic pole.

Note that, as shown in FIG. 1, the yoke 40 (the yokes 40a and 40b) is configured so that the shape thereof as viewed from the front surface side of the substrate 10 is narrowed as approaching the sensitive part 30. This is to concentrate the magnetic field to (to gather the lines of magnetic force on) the sensitive part 30. In other words, the magnetic field in the sensitive part 30 is strengthened to further improve the sensitivity. Note that the width of the portion of the yoke 40 (the yokes 40a and 40b) facing the sensitive part 30 may not be narrowed.

Here, the interval between the yoke 40 (the yokes 40a and 40b) and the sensitive parts 30 may be, for example, 1 μm to 100 μm.

Figure 3:
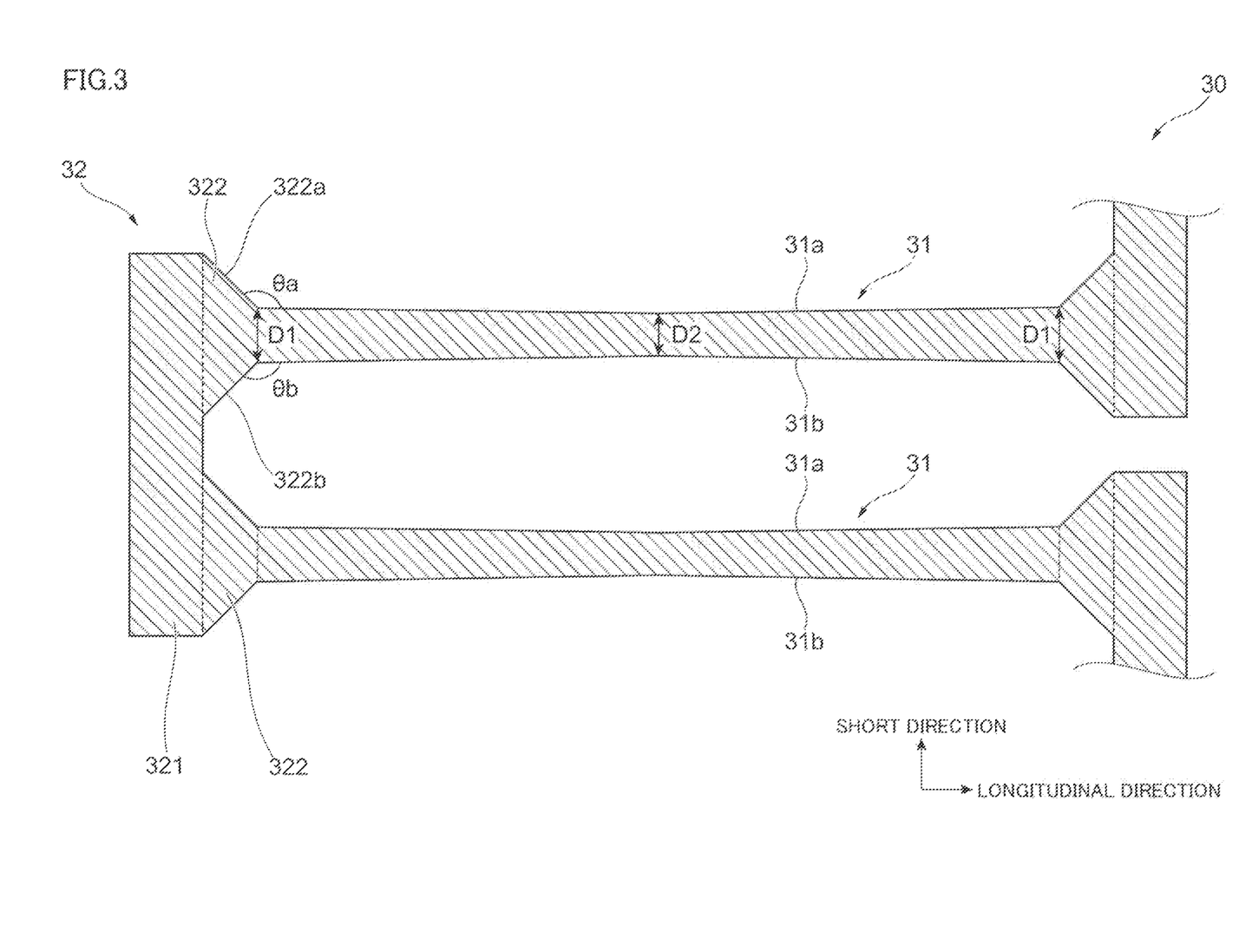
FIG. 3 is an enlarged view of the III part in FIG. 1.

Subsequently, the planar shape of the sensitive element 31 will be described in detail. FIG. 3 is an enlarged view of the III part in FIG. 1. Note that the ratio between the longitudinal direction and the short direction of the sensitive element 31 shown in FIG. 3 is not necessarily accurate.

The plural sensitive elements 31 have a planar shape equal to one another. Each sensitive element 31 has a reed shape with a longitudinal direction and a short direction. In addition, in each sensitive element 31, the width in the short direction differs at both end portions in the longitudinal direction and at the center portion in the longitudinal direction. Note that, in the description of the exemplary embodiment, the width of the sensitive element 31 in the short direction is simply be referred to as "the width of the sensitive element 31", etc., in some cases.

As shown in FIG. 3, in the exemplary embodiment, the width D2 of the sensitive element 31 at the center portion in the longitudinal direction is smaller as compared to the width D1 of the sensitive element 31 at both end portions in the longitudinal direction. Specifically, in each sensitive element 31, the width in the short direction is continuously reduced as approaching from both end portions to the center portion in the longitudinal direction.

To additionally describe, as shown in FIG. 3, each sensitive element 31 includes two long-side parts 31a and 31b extending in the longitudinal direction and facing each other in the short direction. Then, in each sensitive element 31, the space between the two long-side parts 31a and 31b is reduced with as approaching from both end portions to the center portion in the longitudinal direction.

In this specific example, the long-side part 31a of each sensitive element 31 has a curved shape that recesses toward the long-side part 31b so that the distance with the long-side part 31b varies continuously from one end to the other end in the longitudinal direction. Similarly, the long-side part 31b of each sensitive element 31 has a curved shape that recesses toward the long-side part 31a so that the distance with the long-side part 31a varies continuously from one end to the other end in the longitudinal direction.

The length of each sensitive element 31 is not particularly limited, but, for example, the length is about 0.5 mm to 3 mm. In addition, the widths of each sensitive element 31 in the short direction (D1 and D2) are not particularly limited, but, for example, the widths are about 10 μm to 300 μm.

In the exemplary embodiment, it is preferable that the ratio between the width D1 of the sensitive element 31 at both end portions in the longitudinal direction and the width D2 of the sensitive element 31 at the center portion in the longitudinal direction (D1:D2) is in the range from 100:60 to 100:90, though the range may vary depending on the length of the sensitive element 31 in the longitudinal direction or the like. In the case where the width D2 of the sensitive element 31 at the center portion in the longitudinal direction is excessively small relative to the width D1 of the sensitive element 31 at both end portions in the longitudinal direction, the resistance when the current is supplied to the sensitive part 30 is sometimes increased. In addition, in the case where the width D1 of the sensitive element 31 at both end portions in the longitudinal direction and the width D2 of the sensitive element 31 at the center portion in the longitudinal direction are close to each other, the effect of improving the sensitivity, which will be described later, is hardly obtained.

Subsequently, with reference to the above-described FIGS. 1 and 3, the planar shape of the connection part 32 will be described in detail.

As shown in FIG. 3, each connection part 32 includes an extending part 321 that extends along the short direction. Here, in the case of simply referring to the short direction or the longitudinal direction, the term means the short direction or the longitudinal direction of the sensitive element 31. In addition, each connection part 32 includes a taper part 322 that extends in the longitudinal direction from the extending part 321 to connect an end portion in the longitudinal direction of the sensitive element 31 and the extending part 321. Then, the connection part 32 connects the end portions of the two sensitive elements 31 in the longitudinal direction by the extending part 321 and the two taper parts 322, the two sensitive elements 31 being arranged in the short direction.

The extending part 321 has a reed shape extending in the short direction. Then, as shown in FIG. 3, the extending part 321 protrudes in the short direction with respect to the two sensitive elements 31 to be connected. To additionally describe, the length of the extending part 321 in the short direction is longer than the sum of the widths of the two sensitive elements 31 in the short direction and the distance between the two sensitive elements 31 in the short direction.

In addition, it is preferable that the width of the extending part 321 in the longitudinal direction is larger than the width D1 of the sensitive element 31 at both end portions in the longitudinal direction. Consequently, as compared to the case where the width of the extending part 321 in the longitudinal direction is smaller than the width D1 of the sensitive element 31 at both end portions in the longitudinal direction, the resistance when the current is supplied to the sensitive part 30 is reduced.

The taper part 322 has a so-called taper shape, in which the width in the short direction is narrowed as approaching the end portion of the sensitive element 31 along the longitudinal direction. To additionally describe, the taper part 322 includes two side parts 322a and 322b that extend along the longitudinal direction. Then, in the taper part 322, the space between the two side parts 322a and 322b is narrowed as approaching the end portion of the sensitive element 31 along the longitudinal direction.

Moreover, in this specific example, the inclined angles θa and θb, which are formed by the side parts 322a and 322b, respectively, of the taper part 322 with the longitudinal direction, are 135 degrees. The inclined angles θa and θb may be set in the range of, for example, 110 degrees or more and 150 degrees or less, though the range varies depending on the length of the extending part 321 in the short direction, the width of the sensitive element 31 in the short direction, and so on.

In the magnetic sensor 1 of the exemplary embodiment, since the connection part 32 includes the taper part 322; therefore, the lines of magnetic force are likely to be guided to the end portion of the sensitive element 31 in the longitudinal direction. As a result, in the magnetic sensor 1 of the exemplary embodiment, the magnetic field is concentrated on the sensitive element 31 and the magnetic flux density is increased. This can improve the sensitivity of the magnetic sensor 1, as compared to the case where the connection part 32 does not include the taper part 322.

(Action of Magnetic Sensor 1)

Subsequently, the action of the magnetic sensor 1 in the exemplary embodiment will be described as compared to a conventional magnetic sensor whose sensitive element has a shape different from the shape of the sensitive element 31 of the magnetic sensor 1 in the exemplary embodiment (hereinafter, simply referred to as a conventional magnetic sensor).

Figure 4:
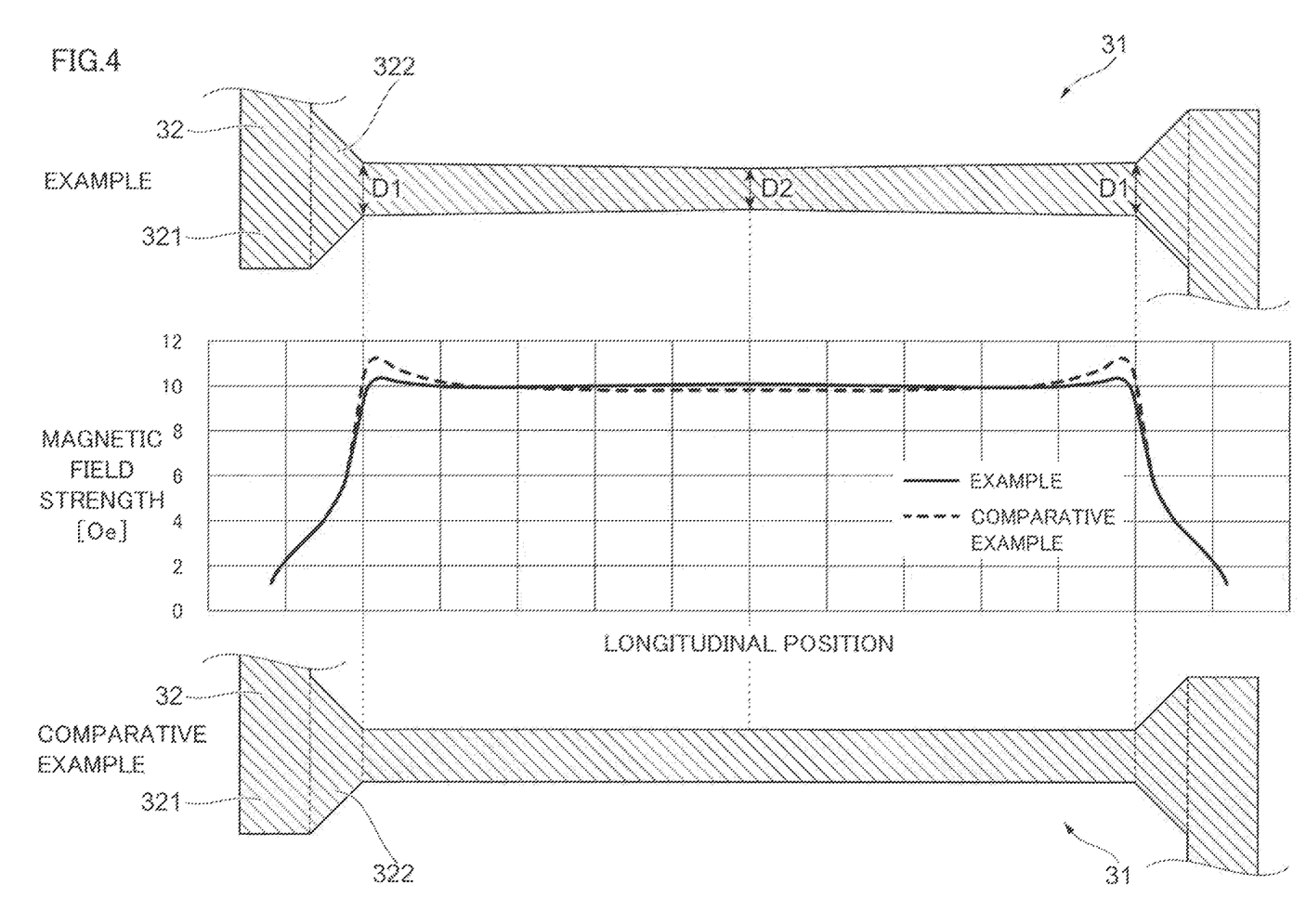
FIG. 4 shows the shape of the sensitive element in the magnetic sensor and a conventional magnetic sensor, and the magnetic field strength in the sensitive element in the magnetic sensor and the conventional magnetic sensor.

FIG. 4 shows the shape of the sensitive element 31 in the magnetic sensor 1 (refer to FIG. 1) and the conventional magnetic sensor, and the magnetic field strength in the sensitive element 31 in the magnetic sensor 1 and the conventional magnetic sensor. In FIG. 4, the shape of the sensitive element 31 and the magnetic field strength of the magnetic sensor 1 in the exemplary embodiment are shown as "Example," and the shape of the sensitive element 31 and the magnetic field strength of the conventional magnetic sensor are shown as "Comparative example." In addition, FIG. 4 shows the magnetic field strength in the sensitive element 31 as a distribution along the longitudinal direction in the case where an external magnetic field of a predetermined magnitude is applied to the sensitive element 31 of the magnetic sensor 1 and the conventional magnetic sensor.

Here, FIG. 4 shows the result obtained by simulation using a computer. Specifically, with respect to the magnetic sensor 1 in the exemplary embodiment having the shape shown in FIGS. 1 to 3, the sensitive part 30 and the yokes 40 were configured by the two-layer soft magnetic material layer 105 (the lower soft magnetic material layer 105a and the upper soft magnetic material layer 105b) composed of $Co_{85}Nb_{12}Zr_3$ with the thickness of 500 μm and the high conductive layer 106 composed of Ag with the thickness of 300 nm.

Moreover, in the magnetic sensor 1 in Example, the width D1 of the sensitive element 31 at both end portions in the longitudinal direction was set to 95 μm, the width D2 of the sensitive element 31 at the center portion in the longitudinal direction was set to 65 μm, and the length of the sensitive element 31 along the longitudinal direction was set to 2 mm. Note that, in the magnetic sensor 1 in Example, as shown in FIG. 3 or the like, the long-side parts 31a and 31b of the sensitive element 31 have the curved shape, and the width of the sensitive element 31 continuously varies from one end to the other end in the longitudinal direction. Then, in the case where an external magnetic field of 10 Oe was applied to the sensitive element 31 along the longitudinal direction, the magnetic field strength in the sensitive element 31 was calculated by simulation.

In addition, the conventional magnetic sensor was the same as the magnetic sensor 1 of the exemplary embodiment except that the width of the sensitive element 31 in the short direction was constant, which was 80 μm, from one end to the other end in the longitudinal direction. Then, in the case where an external magnetic field of 10 Oe was applied to the sensitive element 31, the magnetic field strength in the sensitive element 31 was calculated by simulation.

As shown in FIG. 4, in the magnetic sensor 1 of the exemplary embodiment, in which the width D2 of the sensitive element 31 at the center portion in the longitudinal direction is smaller than the width D1 of the sensitive element 31 at both end portions in the longitudinal direction, the magnetic field strength in the sensitive element 31 is constant over the longitudinal direction, as compared to the conventional magnetic sensor in which the width of the sensitive element 31 is the same from one end to the other end in the longitudinal direction.

Specifically, in the conventional magnetic sensor, the magnetic field strength at both end portions of the sensitive element 31 in the longitudinal direction is significantly large as compared to the magnetic field strength at the center portion in the longitudinal direction. In contrast thereto, in the magnetic sensor 1 of the exemplary embodiment, the difference in the magnetic field strength between both end portions and the center portion of the sensitive element 31 in the longitudinal direction is small as compared to the conventional magnetic sensor.

Figure 5A:
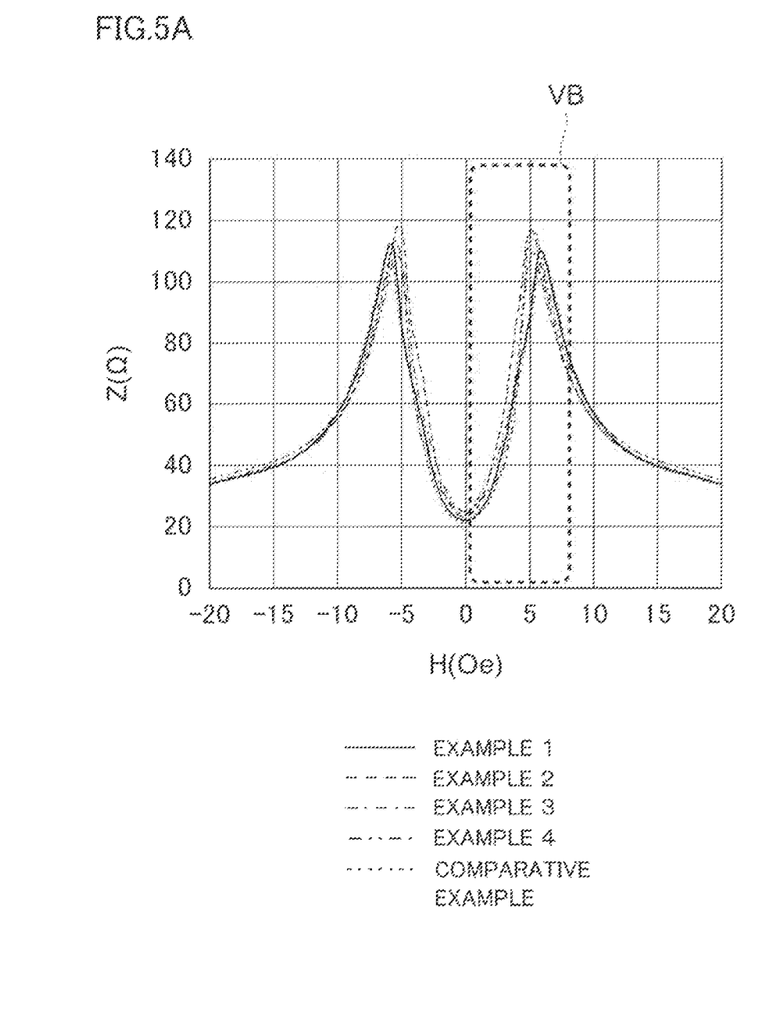
FIGS. 5A and 5B illustrate relations between a magnetic field applied in the longitudinal direction of the sensitive element and an impedance of the sensitive part in the magnetic sensor of the exemplary embodiment and the conventional magnetic sensor, respectively.
Figure 5B:
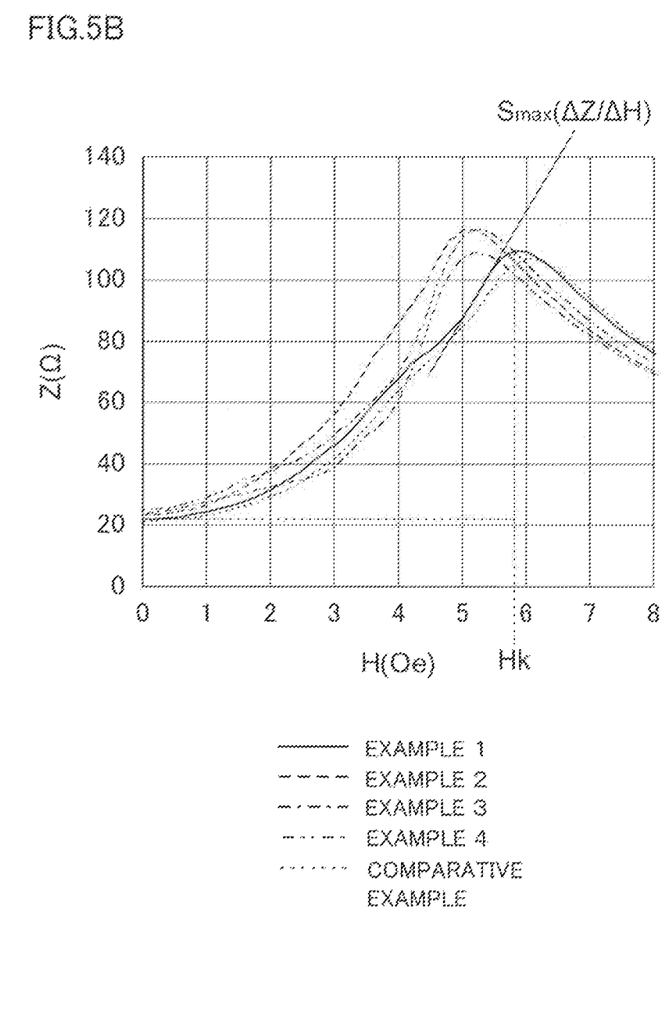

Subsequently, as the action of the magnetic sensor 1 of the exemplary embodiment, the relation between the magnetic field applied in the longitudinal direction of the sensitive element 31 in the sensitive part 30 and the impedance of the sensitive part 30 will be described, as compared to the conventional magnetic sensor. FIGS. 5A and 5B illustrate the relations between the magnetic field applied in the longitudinal direction of the sensitive element 31 and the impedance of the sensitive part 30 in the magnetic sensor 1 of the exemplary embodiment and the conventional magnetic sensor. Note that FIG. 5B is an enlarged view of the VB part in FIG. 5A.

In FIGS. 5A and 5B, the horizontal axis indicates the magnetic field H, and the vertical axis indicates the impedance Z. The impedance Z of the sensitive part 30 is measured by passing a high-frequency current between two terminal parts 33. FIGS. 5A and 5B show the results measured by passing the high-frequency current of 100 MHz between the terminal parts 33 of the sensitive part 30 of the magnetic sensor 1 in the exemplary embodiment and the conventional magnetic sensor. In FIGS. 5A and 5B, the magnetic sensor 1 in the exemplary embodiment is shown as "Example 1" to "Example 4," and the conventional magnetic sensor is shown as "Comparative example." Note that the constituent materials and the shape of the magnetic sensors 1 in Examples 1 to 4 showing the properties thereof in FIGS. 5A and 5B are similar to those of the magnetic sensor 1 of the exemplary embodiment showing the properties thereof in FIG. 4, except for the width of sensitive element 31. In addition, the constituent materials and the shape of the conventional magnetic sensor in Comparative example showing the properties thereof in FIGS. 5A and 5B are similar to those of the conventional magnetic sensor showing the properties thereof in FIG. 4.

In the magnetic sensors 1 in Examples 1 to 4, the widths of the sensitive element 31 (the width D1 of the sensitive element 31 at both end portions in the longitudinal direction and the width D2 of the sensitive element 31 at the center portion in the longitudinal direction) are different from each other. Specifically, in the magnetic sensor 1 in Example 1, the width D1 of the sensitive element 31 at both end portions in the longitudinal direction was set to 85 μm, and the width D2 of the sensitive element 31 at the center portion in the longitudinal direction was set to 75 μm. Moreover, in the magnetic sensor 1 in Example 2, the width D1 of the sensitive element 31 at both end portions in the longitudinal direction was set to 90 μm, and the width D2 of the sensitive element 31 at the center portion in the longitudinal direction was set to 70 μm. Further, in the magnetic sensor 1 in Example 3, the width D1 of the sensitive element 31 at both end portions in the longitudinal direction was set to 95 μm, and the width D2 of the sensitive element 31 at the center portion in the longitudinal direction was set to 65 μm. Still further, in the magnetic sensor 1 in Example 4, the width D1 of the sensitive element 31 at both end portions in the longitudinal direction was set to 100 μm, and the width D2 of the sensitive element 31 at the center portion in the longitudinal direction was set to 60 μm.

As shown in FIGS. 5A and 5B, in the magnetic sensor 1 (and the conventional magnetic sensor), the impedance Z of the sensitive part 30 is varied, increased or decreased, as the absolute value of the magnetic field H increases in the positive direction or the negative direction, with a boundary of the magnetic field H being 0 (H=0). Moreover, the amount of change in the impedance Z (in other words, the slope of the graph) in relation to the change in the magnetic field H depends on the magnitude of magnetic field H.

Consequently, by use of a portion where the amount of variations ΔZ in the impedance Z with respect to the amount of variations ΔH in the magnetic field H to be applied is steep (in other words, the portion where ΔZ/ΔH is large), it is possible to extract extremely weak variations in the magnetic field H as the amount of variations ΔZ in the impedance Z. To put it another way, in the magnetic sensor 1, by applying the magnetic field H, where magnetic sensor 1 has the largest ΔZ/ΔH in the longitudinal direction of the sensitive element 31 (hereinafter, referred to as a bias magnetic field Hb in some cases) by thin film magnet 20, the amount of variations ΔH of the magnetic field H in the vicinity of the bias magnetic field Hb can be measured with high precision.

Note that, in the following description, the slope of the graph ΔZ/ΔH in the bias magnetic field Hb (in other words, the maximum ΔZ/ΔH) is referred to as $S_{max}$ in some cases. In addition, the magnetic field H, where the impedance Z takes the maximum value, is referred to as an anisotropic magnetic field Hk in some cases. Further, the difference between the minimum and maximum values of the impedance Z in the graph (the maximum value of the amount of variations ΔZ of the impedance Z) is referred to as the amount of variations $\Delta Z_{max}$ in some cases.

With respect to the magnetic sensor 1 of the exemplary embodiment (Examples 1 to 4) and the conventional magnetic sensor (Comparative example), Table 1 shows the values of the anisotropic magnetic field Hk, the amount of variations $\Delta Z_{max}$ and $S_{max}$ (=ΔZ/ΔH) obtained based on the relation between the magnetic field H and the impedance Z of the sensitive part 30 shown in FIGS. 5A and 5B.

TABLE 1

| | SENSITIVE ELEMENT | | | | |
| --- | --- | --- | --- | --- | --- |
| | D1 (μm) (BOTH END PORTIONS) | D2 (μm) (CENTER PORTION) | Hk (Oe) | ΔZmax (Ω) | Smax (Ω/Oe) |
| EXAMPLE 1 | 85 | 75 | 5.8 | 92.5 | 57.2 |
| EXAMPLE 2 | 90 | 70 | 5.1 | 97.7 | 65.2 |
| EXAMPLE 3 | 95 | 65 | 5.2 | 88.6 | 74.8 |
| EXAMPLE 4 | 100 | 60 | 5.3 | 92.8 | 57.8 |
| COMPARATIVE EXAMPLE | 80 | | 6.0 | 89.7 | 41.9 |

Here, in the magnetic sensor 1 measuring the amount of variations ΔH in the magnetic field H based on the relation between the magnetic field H and the impedance Z, the sensitivity is increased as $S_{max}$ is large. In addition, according to the relation between the magnetic field H and the impedance Z shown in FIGS. 5A and 5B, as the anisotropic magnetic field Hk is smaller or the amount of variations $\Delta Z_{max}$ is larger, the amount of variations ΔZ tends to be steep and $S_{max}$ tends to be large. In other words, in the magnetic sensor 1, sensitivity is improved and is preferable as the anisotropic magnetic field Hk is smaller or the amount of variations $\Delta Z_{max}$ is larger.

As shown in Table 1, in the magnetic sensor 1 in Examples 1 to 4, the anisotropic magnetic field Hk is small as compared to the magnetic sensor in Comparative example. In addition, in the magnetic sensor 1 in Examples 1, 2, and 4, the amount of variations $\Delta Z_{max}$ is large as compared to the magnetic sensor in Comparative example. Then, in the magnetic sensor 1 in Examples 1 to 4, $S_{max}$ is increased as compared to the magnetic sensor in Comparative example.

As described above, in the magnetic sensor 1 in the exemplary embodiment, the width D2 of the sensitive element 31 at the center portion in the longitudinal direction is smaller as compared to the width D1 of the sensitive element 31 at both end portions in the longitudinal direction; therefore, the magnetic field is likely to concentrate on the sensitive element 31, and the magnetic field strength becomes uniform. As a result, in the magnetic sensor 1 in the exemplary embodiment, as compared to the case where the width of the sensitive element 31 is constant from one end to the other end in the longitudinal direction, $S_{max}$ is increased, and thereby the sensitivity can be improved.

(Method of Manufacturing Magnetic Sensor 1)

Next, a specific example of a method of manufacturing the magnetic sensor 1 will be described.

FIGS. 6A to 6E illustrate the specific example of the method of manufacturing the magnetic sensor 1. FIGS. 6A to 6E show respective processes in the method of manufacturing the magnetic sensor 1. The processes proceed in the order of FIGS. 6A to 6E. FIGS. 6A to 6E show representative processes, and other processes may be included. FIGS. 6A to 6E correspond to the cross-sectional view cut along the II-II line in FIG. 1 shown in FIG. 2.

As described above, the substrate 10 is composed of a non-magnetic material; for example, an oxide substrate, such as glass or sapphire, a semiconductor substrate, such as silicon, or a metal substrate, such as aluminum, stainless steel, or a nickel-phosphorus-plated metal, can be provided. On the substrate 10, for example, streaky grooves or streaky asperities with the radius of curvature Ra of 0.1 nm to 100 nm may be provided by use of a polisher or the like. Note that it is preferable to provide the streaks of the streaky grooves or the streaky asperities in a direction connecting the north pole and the south pole of the thin film magnet 20 configured with the hard magnetic material layer 103. By doing so, the crystal growth in the hard magnetic material layer 103 is promoted in the direction of the grooves. Consequently, the axis of easy magnetization of the thin film magnet 20 configured with the hard magnetic material layer 103 is more likely to face the groove direction (the direction connecting the north pole and the south pole of the thin film magnet 20). In other words, magnetization of the thin film magnet 20 is made easier.

Here, as a specific example, the substrate 10 will be described as glass having a diameter of about 95 mm and a thickness of about 0.5 mm. In the case where the planar shape of the magnetic sensor 1 is several millimeters square, plural magnetic sensors 1 are collectively manufactured on the substrate 10, and thereafter, divided (cut) into individual magnetic sensors 1. In FIGS. 6A to 6E, attention is focused on one magnetic sensor 1 depicted at the center, and a part of each of the adjacent magnetic sensors 1 on the right and left sides is also shown. Note that the border between the adjacent magnetic sensors 1 is indicated by a long-dot-and-dash line.

Figure 6A:
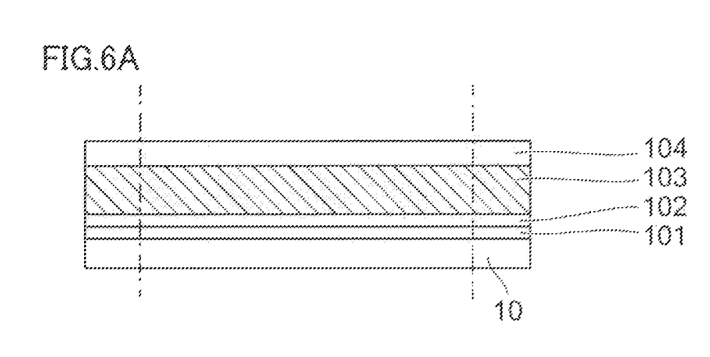
FIGS. 6A to 6E illustrate a specific example of a method of manufacturing the magnetic sensor.

As shown in FIG. 6A, after washing the substrate 10, on one of the surfaces (hereinafter, referred to as a front surface) of the substrate 10, the adhesive layer 101, the control layer 102, the hard magnetic material layer 103 and the dielectric layer 104 are deposited (accumulated) in order, to thereby form a laminated body.

First, the adhesive layer 101 that is an alloy containing Cr or Ni, the control layer 102 that is an alloy containing Cr and the like, the hard magnetic material layer 103 that is a Co alloy constituting the thin film magnet 20 are continuously deposited (accumulated) in order. The deposition can be performed by a sputtering method or the like. The substrate 10 is moved to face plural targets formed of respective materials in order, and thereby the adhesive layer 101, the control layer 102 and the hard magnetic material layer 103 are laminated on the substrate 10 in order. As described above, in forming the control layer 102 and the hard magnetic material layer 103, the substrate 10 may be heated to, for example, 100° C. to 600° C. for accelerating the crystal growth.

Note that, in deposition of the adhesive layer 101, the substrate 10 may be heated or may not be heated. To remove the moisture and so forth absorbed onto the surface of the substrate 10, the substrate 10 may be heated before the adhesive layer 101 is deposited.

Next, the dielectric layer 104, which is oxide, such as $SiO_2$, $Al_2O_3$, or $TiO_2$, or nitride, such as $Si_3N_4$ or MN is deposited (accumulated). Deposition of the dielectric layer 104 can be performed by a plasma CVD method, a reactive sputtering method or the like.

Figure 6B:
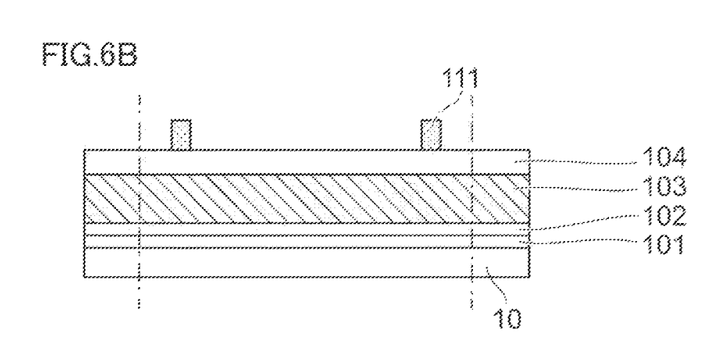

Then, as shown in FIG. 6B, a pattern by photoresist (a resist pattern) 111, which has an opening serving as a portion where the sensitive part 30 and the yokes 40 (the yokes 40a and 40b) are formed, is formed by a publicly known photolithography technique. Note that, in the exemplary embodiment, by controlling the shape of the resist pattern 111, the above-described planar shape of the sensitive element 31 and the connection part 32 can be formed.

Figure 6C:
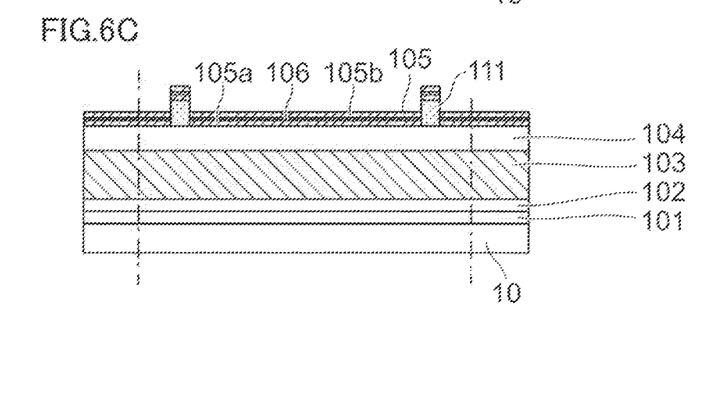

Then, as shown in FIG. 6C, the lower soft magnetic material layer 105a, which is a Co alloy constituting the sensitive part 30, the high conductive layer 106, which is a conductor with high conductivity as compared to the soft magnetic material layer 105, and the upper soft magnetic material layer 105b, which is a Co alloy constituting the sensitive element 31, are deposited in order. The deposition of the soft magnetic material layer 105 (the lower soft magnetic material layer 105a and the upper soft magnetic material layer 105b) and the high conductive layer 106 can be performed by using, for example, the sputtering method.

Figure 6D:
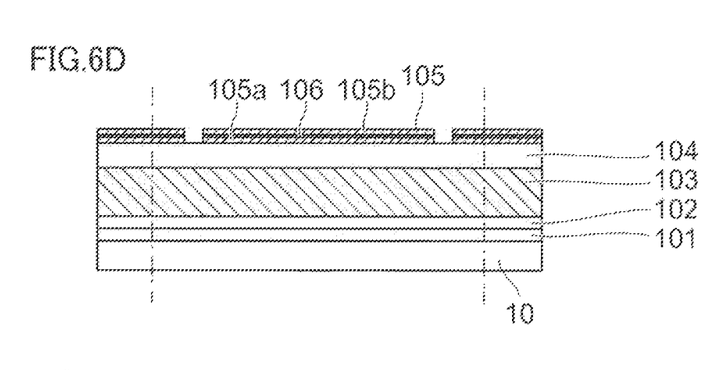

As shown in FIG. 6D, the resist pattern 111 is removed, and the soft magnetic material layer 105 (the lower soft magnetic material layer 105a and the upper soft magnetic material layer 105b) and the high conductive layer 106 on the resist pattern 111 are also removed (lifted-off). Consequently, the sensitive part 30 and the yokes 40 (the yoke 40a and 40b) constituted by the soft magnetic material layer 105 (the lower soft magnetic material layer 105a and the upper soft magnetic material layer 105b) and the high conductive layer 106 are formed. In other words, the sensitive part 30 and the yokes 40 are simultaneously formed by the deposition of the soft magnetic material layer 105 and the high conductive layer 106.

Thereafter, in the soft magnetic material layer 105, the uniaxial magnetic anisotropy is imparted in the short direction of the sensitive element 31 in the sensitive part 30 (refer to FIG. 2). The impartation of the uniaxial magnetic anisotropy to the soft magnetic material layer 105 can be performed by heat treatment at 400° C. in a rotating magnetic field of, for example, 3 kG (0.3 T) (heat treatment in the rotating magnetic field) and by heat treatment at 400° C. in a static magnetic field of 3 kG (0.3 T) (heat treatment in the static magnetic field) subsequent thereto. At this time, the soft magnetic material layer 105 constituting the yokes 40 is provided with the similar uniaxial magnetic anisotropy. However, the yokes 40 just have to play a role of a magnetic circuit, and may not be provided with the uniaxial magnetic anisotropy.

Next, the hard magnetic material layer 103 constituting the thin film magnet 20 is magnetized. Magnetizing of the hard magnetic material layer 103 can be performed by, in the static magnetic field or in a pulsed magnetic field, continuously applying a magnetic field larger than a coercive force of the hard magnetic material layer 103 until magnetization of the hard magnetic material layer 103 becomes saturated.

Figure 6E:
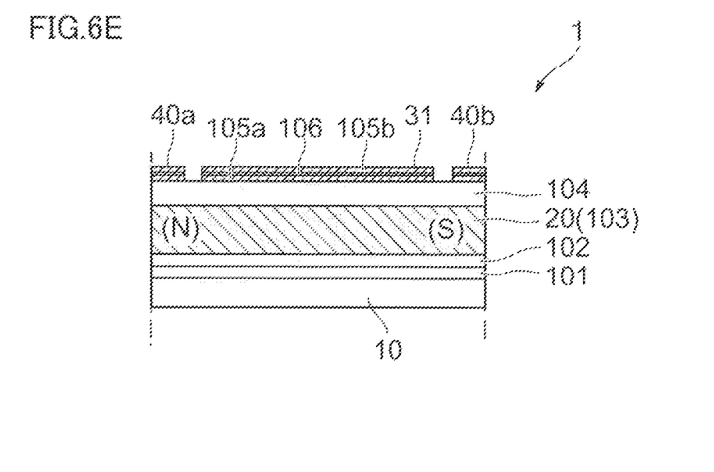

Thereafter, as shown in FIG. 6E, the plural magnetic sensors 1 formed on the substrate 10 is divided (cut) into the individual magnetic sensors 1. In other words, as shown in the plan view of FIG. 1, the substrate 10, the adhesive layer 101, the control layer 102, the hard magnetic material layer 103, the dielectric layer 104, the soft magnetic material layer 105, and the high conductive layer 106 are cut to have a quadrangular planar shape. Then, on the side surfaces of the hard magnetic material layer 103 that has been divided (cut), magnetic poles (the north pole and the south pole) of the thin film magnet 20 are exposed. Thus, the magnetized hard magnetic material layer 103 serves as the thin film magnet 20. The division (cutting) can be performed by a dicing method, a laser cutting method or the like.

Note that, before the process of dividing the plural magnetic sensors 1 into the individual magnetic sensors 1 shown in FIG. 6E, the adhesive layer 101, the control layer 102, the hard magnetic material layer 103, the dielectric layer 104, the soft magnetic material layer 105, and the high conductive layer 106 between the adjacent magnetic sensors 1 on the substrate 10 may be removed by etching so that the planar shape of the magnetic sensor 1 is quadrangular (the planar shape of the magnetic sensor 1 shown in FIG. 1). Then, the exposed substrate 10 may be divided (cut).

Moreover, after the process of forming the laminated body shown in FIG. 6A, the adhesive layer 101, the control layer 102, the hard magnetic material layer 103 and the dielectric layer 104 may be processed so that the planar shape of the magnetic sensor 1 is quadrangular (the planar shape of the magnetic sensor 1 shown in FIG. 1).

Note that the processes in the manufacturing method shown in FIGS. 6A to 6E are simplified as compared to these manufacturing methods.

In this manner, the magnetic sensor 1 is manufactured. Note that impartation of the uniaxial magnetic anisotropy to the soft magnetic material layer 105 and/or magnetization of the thin film magnet 20 may be performed on the magnetic sensor 1 or plural magnetic sensors 1 after the process of dividing the magnetic sensor 1 into the individual magnetic sensors 1 shown in FIG. 6E.

Note that, in the case where the control layer 102 is not provided, it becomes necessary to impart the magnetic anisotropy in a plane by causing the crystal growth by heating the hard magnetic material layer 103 to not less than 800° C. after the hard magnetic material layer 103 was deposited. However, in the case where the control layer 102 is provided as in the magnetic sensor 1 to which the exemplary embodiment is applied, since the crystal growth is accelerated by the control layer 102, the crystal growth caused by high temperature, such as not less than 800° C., is not required.

In addition, impartation of the uniaxial magnetic anisotropy to the sensitive element 31 may be performed in depositing the soft magnetic material layer 105, which is a Co alloy constituting the sensitive part 30, by use of a magnetron sputtering method, instead of being performed in the above-described heat treatment in the rotating magnetic field and heat treatment in the static magnetic field. In the magnetron sputtering method, a magnetic field is formed by using magnets and electrons generated by discharge are enclosed on a surface of a target. This increases collision probability of electrons and gases to accelerate ionization of gases, to thereby improve deposition rate of a film. By the magnetic field formed by the magnets used in the magnetron sputtering method, the soft magnetic material layer 105 is deposited, and at the same time, the uniaxial magnetic anisotropy is imparted to the soft magnetic material layer 105. By doing so, it is possible to omit the process of imparting the uniaxial magnetic anisotropy in the heat treatment in the rotating magnetic field and the heat treatment in the static magnetic field.

So far, the exemplary embodiment has been described; however, various modifications may be available without deviating from the gist of the present invention.

In the above-described magnetic sensor 1, the long-side parts 31a and 31b of the sensitive element 31 have a curved shape so that the width of the sensitive element 31 varies continuously from one end to the other end in the longitudinal direction, but the present invention is not limited thereto. For example, as long as the width D2 of the sensitive element 31 at the center portion in the longitudinal direction is smaller than the width D1 of the sensitive element 31 at both end portions in the longitudinal direction, the sensitive element 31 may have the shape in which the width thereof linearly varies from one end to the center in the longitudinal direction and the long-side parts 31a and 31b thereof are bent at the center portion.

In addition, in the above-described magnetic sensor 1, in all of the plural sensitive elements 31, the width D2 of the sensitive element 31 at the center portion in the longitudinal direction is small as compared to the width D1 of the sensitive element 31 at both end portions in the longitudinal direction; however, the present invention is not limited thereto. In the case where the magnetic sensor 1 includes the plural sensitive elements 31, in at least one sensitive element 31, the width D2 of the sensitive element 31 at the center portion in the longitudinal direction may be smaller as compared to the width D1 of the sensitive element 31 at both end portions in the longitudinal direction.

Moreover, in the above-described magnetic sensor 1, the connection part 32 includes the taper part 322 in which the width in the short direction is narrowed as approaching the end portion of the sensitive element 31 along the longitudinal direction, but the present invention is not limited thereto. The connection part 32 may be, for example, configured only with the rectangular extending part 321, which extends along the short direction, without having the taper part 322.

However, from the standpoint of increasing the magnetic flux density in the sensitive element 31 and improving the sensitivity, it is preferable that the connection part 32 includes the taper part 322.

Further, in the above-described magnetic sensor 1, the sensitive elements 31, the connection parts 32 and the terminal parts 33 of the sensitive part 30 are constituted by the two-layer soft magnetic material layer 105 (the lower soft magnetic material layer 105a and the upper soft magnetic material layer 105b) and the high conductive layer 106; however, the present invention is not limited thereto. The sensitive elements 31, the connection parts 32 or the terminal parts 33 of the sensitive part 30 may be constituted by a single-layer soft magnetic material layer.

The foregoing description of the exemplary embodiment of the present invention has been provided for the purposes of illustration and description. It is not intended to be exhaustive or to limit the invention to the precise forms disclosed. Obviously, many modifications and variations will be apparent to practitioners skilled in the art. The exemplary embodiment was chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A magnetic sensor comprising:
a non-magnetic substrate; and
a sensitive element that is provided on the substrate, composed of a soft magnetic material, having a longitudinal direction and a short direction, provided with uniaxial magnetic anisotropy in a direction crossing the longitudinal direction, having a width at a center the longitudinal direction that is smaller compared to a width at each of both end portions in the longitudinal direction, and sensing a magnetic field by a magnetic impedance effect,
wherein, in the sensitive element, a width in the short direction is continuously reduced from both of the end portions to the center in the longitudinal direction.

2. The magnetic sensor according to claim 1, wherein the sensitive element comprises a plurality of sensitive elements arranged in the short direction with intervals, and
a connection part is included to connect end portions of the sensitive elements in the longitudinal direction, the sensitive elements being adjacent to each other in the short direction, and the width of the connection part in the short direction being narrowed as approaching the sensitive elements along the longitudinal direction.

3. The magnetic sensor according to claim 1, wherein a ratio between the width of the sensitive element at each of both the end portions in the longitudinal direction and the width of the sensitive element at the center in the longitudinal direction is in a range from 100:60 to 100:90.

4. The magnetic sensor according to claim 2, wherein a ratio between the width of the sensitive element at each of both the end portions in the longitudinal direction and the width of the sensitive element at the center in the longitudinal direction is in a range from 100:60 to 100:90.

* * * * *